United States Patent
Hoeger

(10) Patent No.: US 10,932,332 B2
(45) Date of Patent: Feb. 23, 2021

(54) METHODS AND APPARATUS TO PROVIDE ASYMMETRICAL MAGNETIC FIELDS, AND INDUCTION HEATING USING ASYMMETRICAL MAGNETIC FIELDS

(71) Applicant: Illinois Tool Works Inc., Glenview, IL (US)

(72) Inventor: Michael Hoeger, Appleton, WI (US)

(73) Assignee: Illinois Tool Works Inc., Glenview, IL (US)

(*) Notice: Subject to any disclaimer, the term of this patent is extended or adjusted under 35 U.S.C. 154(b) by 280 days.

(21) Appl. No.: 16/046,710

(22) Filed: Jul. 26, 2018

(65) Prior Publication Data

US 2019/0037651 A1 Jan. 31, 2019

Related U.S. Application Data

(60) Provisional application No. 62/539,259, filed on Jul. 31, 2017, provisional application No. 62/539,306, filed on Jul. 31, 2017.

(51) Int. Cl.

| | |
|---|---|
| *H05B 6/44* | (2006.01) |
| *H05B 6/10* | (2006.01) |
| *H01F 5/00* | (2006.01) |
| *H05B 6/40* | (2006.01) |
| *H05K 1/16* | (2006.01) |
| *H05K 1/03* | (2006.01) |
| *H01F 7/20* | (2006.01) |
| *H05K 1/02* | (2006.01) |
| *H05K 1/11* | (2006.01) |

(52) U.S. Cl.
CPC .............. *H05B 6/40* (2013.01); *H01F 7/20* (2013.01); *H05B 6/44* (2013.01); *H05K 1/0393* (2013.01); *H05K 1/165* (2013.01); *H05K 1/0212* (2013.01); *H05K 1/118* (2013.01); *H05K 2201/0145* (2013.01); *H05K 2201/0154* (2013.01); *H05K 2201/086* (2013.01)

(58) Field of Classification Search
CPC . H05B 6/40; H05B 6/44; H05K 1/165; H05K 1/0393; H05K 1/118; H05K 2201/086; H05K 2201/0154; H05K 2201/0145; H05K 1/0212; H01F 7/20
USPC ....... 219/672, 635, 645, 646, 653, 673, 674, 219/656, 633, 660, 654, 676; 336/55, 75, 336/223, 232, 200, 220
See application file for complete search history.

(56) References Cited

U.S. PATENT DOCUMENTS 6,873,242 B2 * 3/2005 Ahrens ............... H01F 17/0006
336/174

* cited by examiner

*Primary Examiner* — Quang T Van
(74) *Attorney, Agent, or Firm* — McAndrews, Held & Malloy, Ltd.

(57) ABSTRACT

A system to provide induction heating includes a welding-type power supply to apply an electric current, a first electromagnetic array formed on a first substrate and a second electromagnetic array formed on a second substrate. Each array includes a plurality of conductors arranged in a varying configuration such that, upon application of the electric current, each conductor of the plurality of conductors generates a magnetic field in a polarity that is other than a polarity of a corresponding magnetic field of at least one adjacent conductor. A first surface and a second surface opposite the first surface, the first surface having a strong magnetic field relative to a weak magnetic field associated with the second surface in response to the electric current.

20 Claims, 12 Drawing Sheets

METHODS AND APPARATUS TO PROVIDE ASYMMETRICAL MAGNETIC FIELDS, AND INDUCTION HEATING USING ASYMMETRICAL MAGNETIC FIELDS

CROSS-REFERENCE TO RELATED APPLICATIONS

This patent application claims priority to and the benefit of U.S. Provisional Patent Application Ser. No. 62/539,259, filed on Jul. 31, 2017; and Application Ser. No. 62/539,306, filed on Jul. 31, 2017, which are incorporated herein by reference in its entirety.

BACKGROUND

This disclosure relates generally to magnetics and, more particularly, to methods and apparatus to provide asymmetrical magnetic fields, and induction heating using asymmetrical magnetic fields.

Producing an asymmetric magnetic field can be advantageous in a variety of applications. For example, in induction heating applications it would be desirable to produce a magnetic field at an interface with a material to be heated without producing significant stray magnetic fields below or to the sides of the material, thereby transferring magnetic energy to the material.

SUMMARY

Methods and systems are provided for providing asymmetrical magnetic fields, such as a Halbach array, and for induction heating using asymmetrical magnetic fields, substantially as illustrated by and described in connection with at least one of the figures, as set forth more completely in the claims.

In disclosed examples, a system to provide induction heating includes a welding-type power supply to apply an electric current. A first electromagnetic array is formed on a first substrate, and a second electromagnetic array is formed on a second substrate. Each array includes a plurality of conductors arranged in a varying configuration such that, upon application of the electric current, each conductor of the plurality of conductors generates a magnetic field in a polarity that is other than a polarity of a corresponding magnetic field of at least one adjacent conductor. Each array further includes a first surface and a second surface opposite the first surface, the first surface having a strong magnetic field relative to a weak magnetic field associated with the second surface in response to the electric current.

In some examples, the first electromagnetic array and the second electromagnetic array are connected to form one or more of a regular shape or an irregular shape. For example, the regular shape may include at least one of a triangular shape, a rectangular shape, a circular shape, and an annulus, whereas the irregular shape may include a curved shape, an L-shaped shape, a U-shaped shape, and an M-shaped shape.

In examples, the first electromagnetic array and the second electromagnetic array are electrically connected in parallel. In examples, the first electromagnetic array and the second electromagnetic array are electrically connected in series.

In some examples, each array is overmolded with a substance comprising one or more of silicone, polymers, or rubber. In examples, the substance is doped with a material selected to increase magnetic permeability of each array. In examples, the array includes a layer of resistive heating elements overlying each substrate. In examples, each substrate comprises a flexible material, and in some examples the flexible material is a flexible printed circuit board. In examples, the flexible material may include one or more of a polyimide film, polyamide film, or a polyester resin.

In other disclosed examples, a system provides induction heating and includes a first electromagnetic array formed on a first substrate electrically connected to a first welding-type power supply to apply a first electric current, and a second electromagnetic array formed on a second substrate electrically connected to a second welding-type power supply to apply a second electric current. Each array includes a plurality of conductors arranged in a varying configuration such that, upon application of the first or second electric current, each conductor of the plurality of conductors generates a magnetic field in a polarity that is other than a polarity of a corresponding magnetic field of at least one adjacent conductor. Each array further includes a first surface and a second surface opposite the first surface, the first surface having a strong magnetic field relative to a weak magnetic field associated with the second surface in response to the electric current, In some examples, a controller is included to control the first and second power supplies to apply the first and second electric currents to the first and second electromagnetic arrays, respectively. In examples, an application of the first and second electric currents generate magnetic fields to attract a material suitable for induction heating to the first and second electromagnetic arrays.

In examples, a controller is configured to control the first power supply to selectively apply the first electric current to the first electromagnetic array independently of the second power supply and the second electromagnetic array.

In examples, the first electromagnetic array, the second electromagnetic array, the first power supply and the power supply are electrically connected in parallel. In examples, the first electromagnetic array, the second electromagnetic array, the first power supply and the power supply are electrically connected in series.

In some examples, a frame is included and configured to modify an area of one of the first electromagnetic array or the second electromagnetic array. In examples, the frame has a variable length and/or shape, and is frame configured to modify the area of the system to one or more desired shapes. In examples, the frame includes another electromagnet to cause an attractive force to compress the footprint of the array when activated.

DETAILED DESCRIPTION

Figure 1:
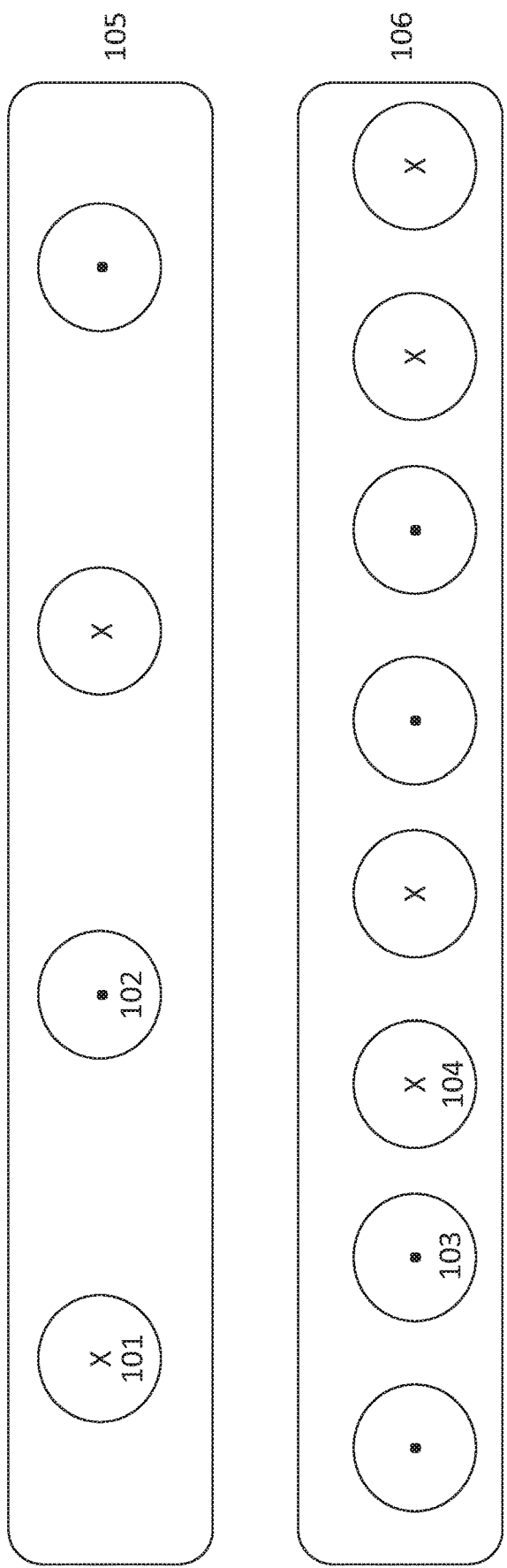
FIG. 1 shows an exemplary array in accordance with aspects of this disclosure.

Devices configured to project asymmetrical magnetic fields have been employed in a variety of industries, such as induction heating. Conventional systems employing asymmetrical magnetic fields provide a uniform magnetic field on a uniform surface. Flexibility to modularize and selectively apply a magnetic field would allow for heating of non-uniform surfaces, as well as inducing heating on selected, non-uniform patterns.

A disclosed example electromagnetic array includes a substrate defined by a plurality of regions. Each region includes a plurality of conductors arranged in a varying configuration such that, upon application of an electric current, each conductor of the plurality of conductors generates a magnetic field in a polarity that is other than a polarity of a corresponding magnetic field of at least one adjacent conductor. Each region further includes a first surface and a second surface opposite the first surface, the first surface having a strong magnetic field relative to a weak magnetic field associated with the second surface in response to the electric current. A first region of the plurality of regions is adjacent to at least one other region of the plurality of regions, and configured such that a polarity of the strong magnetic field associated with the first region is in a polarity other than a polarity of the strong magnetic field associated with the at least one other region.

In some examples, the array includes a controller to selectively apply the electric current to the first region of the plurality of regions independently of a second region of the plurality of regions. In some examples, the polarity of the strong magnetic field associated with the first region is in a polarity opposite the polarity of the strong magnetic field associated with the at least one other region.

Some example arrays include a controller to selectively apply the electric current to a plurality of conductors associated with a subset of the plurality of regions that are within a magnetic influence of a material suitable for induction heating, the application of the electric current to inductively heat an area of the material corresponding to the subset of the plurality of regions.

In some examples, the array is overmolded with a substance comprising silicone. In some examples, the substance is doped with a material selected to increase magnetic permeability of the array. Additionally or alternatively, the overmolded substance can include a variety of materials that are flexible and/or able to withstand high temperature, such as materials selected from a fluoropolymer group, high temperature rubbers, as only a few examples known to those skilled in the art. Some example arrays include a layer of resistive heating elements overlying the substrate. In some examples, the substrate comprises a flexible material. In some examples, the flexible material is a flexible printed circuit board. In some examples, the flexible material comprises a polyimide film.

In some examples, two or more regions of the plurality of regions are connected to form one or more of a regular shape or an irregular shape. In some examples, the regular shape comprises at least one of a triangular shape, a rectangular shape, a circular shape, and an annulus. In some examples, the irregular shape comprises a curved shape, an L-shaped shape, a U-shaped shape, and an M-shaped shape. In some examples, one or more regions of the plurality of regions is independently connected to at least one electric current source. In some examples, each conductor of each region is connected to a single electric current source.

A conductor, as used herein, may include one or more individual conductive elements that may be combined to function as a single conductor. Induction heating is a method for producing heat in a localized area on a susceptible metal object. Induction heating involves applying an electric signal to a conductor placed near a specific location on a piece of metal to be heated. The current in the loop creates a magnetic flux within the metal to be heated. Current is induced in the metal by the magnetic flux and the internal resistance of the metal causes it to heat up in a relatively short period of time. Induction heating power supply, as used herein, refers to a power source that is capable of providing power to an induction conductor to induce heat in a metallic workpiece. Induction heating system, as used herein, includes a power source that can provide power for induction heating (e.g., induce heat in a workpiece in a welding application). Inductor winding, as used herein, includes a winding that induces a magnetic field when current flows therein.

Welding-type power, as used herein, refers to power suitable for welding, plasma cutting, induction heating, air carbon-arc cutting and/or gouging (CAC-A), cladding, and/or hot wire welding/preheating (including laser welding and laser cladding). Welding-type system, as used herein, includes any device capable of supplying power suitable for welding, plasma cutting, induction heating, CAC-A and/or hot wire welding/preheating (including laser welding and laser cladding), including inverters, converters, choppers, resonant power supplies, quasi-resonant power supplies, etc., as well as control circuitry and other ancillary circuitry associated therewith.

Electromagnetic field inducing devices have been employed in various applications, such as induction heating blankets, printed circuit board (PCB) induction heating elements, thin magnet fixtures, wireless energy transfer devices, high-strength electromagnets, for instance. The array described herein may be advantageously used for any of a variety of applications, such as induction heating, wireless power transfer, plasma reactors, and magnetic resonance imaging, by way of example. Applications to induction heating may include induction cooktops, medical applications, industrial applications, wireless charging, and tool and machine manufacturing.

The present disclosure describes an array defined by a strong magnetic field on one side and a relatively weak magnetic field on the other side. The magnetic field is produced by orienting conductors such that, when an electrical current is provided, the resulting magnetic fields work in concert to focus the magnetic field to one side of the array, similar to a Halbach array. Producing a magnetic field in this manner has many advantages. For example, the array is simpler to manufacture, the array can be mounted and/or printed on a flexible substrate, the array may wrap itself around objects of varying geometries (e.g., non-planar, complex surfaces), and the array may be modular so that multiple arrays can be combined to create a larger and/or uniquely shaped array, to name but a few.

The conductors employed in the examples provided herein can take many forms, in accordance with each particular application. In some examples, the conductors are printed on a PCB in a manner to induce a magnetic field on a single surface of the array, as described in greater detail, below. The conductors may take the form of coiled wires (e.g., windings), arranged in a pattern such that the coiled wires produce an asymmetric magnetic field in response to an electric current. In some examples, the coiled wires may be arranged to substantially cancel a magnetic field below the array, while concentrating the magnetic field on the opposite surface. Accordingly, energy is transferred from the array to a target material on a given surface, whereas the magnetic field on the opposing side is substantially zero.

Disclosed examples may be used in a variety of induction heating applications, including heating a pipe to be welded. Presently most pipe induction heating is performed by wrapping a conductor around the pipe to make a magnetic field axial to the pipe's surface. Disclosed examples include a plurality of magnetic poles normal and axial to the pipe surface created by an electromagnet Halbach array. In this example, installation of such an array is simpler than in conventional methods. In particular, the array does not need to be carefully and precisely wrapped since it can be blanketed on to the surface of the pipe, and when energized the array may pull itself up to the surface for optimal inductive coupling. Additionally, the array as described herein could be much lighter than present pipe induction heating applications using coils (e.g., resistive heating elements).

The overall dimensions and shape of the array can be altered since additional arrays of various sizes and shapes may be attached to each other so that complex shapes can be created. In combining various arrays, each can be separately connected to a power source and/or controller. In this manner, one or more of the connected arrays can be selectively energized and magnetized to achieve targeted induction heating.

Some advantages realized in the new technology include ease of attachment and a modular fit capable of wrapping around complex geometries. The attractive tendencies of the array may allow the array to pull itself against a surface, limiting the distance of the magnetic field and the ferrous material for strong magnetic coupling. The completed array can include conductors that are printed on a circuit board (e.g., PCB), resulting in a thin and light device that is straightforward to manufacture. The array may be printed onto or otherwise arranged on a substrate to provide structural support for the conductors. The substrate may be made of a flexible substrate (e.g., formed of flexible polymer such as polyimide films, polyamide films, polyester resins, or any other suitable material) that provides a conformable surface. Using a flexible substrate (e.g., Kapton, nylon, Mylar, etc.), the attractive magnetic forces may cause the array to curl against and/or around a target materials, which can be thin in comparison to previous systems (e.g., the ability to wrap the array around an irregularly shaped workpiece to be inductively heated).

A conductor formed in/on the substrate (e.g., a coiled wire) may be made from a variety of metallic and other conductors, such as wire (e.g., Litz wire), a printed conductor, etc. The term "printed conductor" is intended to refer to conductors formed by, for instance, additive manufacturing techniques to deposit the conductor on the substrate or etching conductive regions to form the conductors. The conductors may be any type of conductive material (e.g., copper, aluminum, etc.).

In some examples, the array can include a mechanism (not shown) configured to modify the area of the array. For instance, the mechanism can comprise a surrounding ring or frame of a variable length such that when a force or tension is applied to the ring, the area defining the array shrinks. In another example, the mechanism can be another electromagnet independent of the conductors to cause an attractive force to compress the footprint of the array. The mechanism can be configured such that, upon actuation, the array takes on a desired shape (e.g., to wrap around a specific geometric shape).

Due to the configuration that focuses a magnetic field, the array can be employed in inductive charging devices (e.g., wireless charging). Further, the focused magnetic field would reduce errant fields, and could reduce electromagnetic interference (EMI). Applications to wireless power transfer may include chargers for portable electronic devices having energy storage (e.g., a battery), such as chargers for portable computing devices including mobile phones, tablet computers, etc.

FIG. 1 shows an example array, where multiple layers (e.g., planes 105, 106) include conductors that cooperate to produce an asymmetrical magnetic field. The planes 105, 106 of FIG. 1 are arranged to generate a strong magnetic field on a first surface in response to an electric current, while simultaneously limiting any magnetic field on an opposite surface. The residual magnetic component of the opposite surface is a relatively weak magnetic field, as it is impractical to completely eliminate a magnetic field on the second surface. For example, a conductor 101 is in a top plane 105 with current flowing into the plane of the page as denoted by the "x". A conductor 102 is on the top plane 105 with current flowing out of the plane of the page as denoted by the ".". The conductors can be constructed as a single wire, as multiple insulated wires such as Litz wire, or be formed by a wire loop from adjacent conductors from either the top or bottom planes 150, 106.

A conductor 103 is in a bottom plane 106 with current flowing out of the plane of the page as denoted by the ".". A conductor 104 is in the bottom plane 106 with current flowing into the plane of the page as denoted by the "x". Similarly to conductors 101, 102, conductors 103, 104 can be a single wire, multiple insulated wires such as Litz wire, or be formed by a wire loop from adjacent conductors from either the top or bottom plane.

The current carried by the top plane 105 conductors 101 and 102 can be equal (e.g., 25 amperes per wire, using 4 wires for a total of 100 amperes per conductor). The current carried by the bottom plane 106 conductors 103 and 104 can also be equal (e.g., 25 amperes per wire, using a single wire for a total of 25 amperes per conductor). However, the current carried by the by the top plane 105 and bottom plane 106 conductors are not necessarily equal. The proper current carried by the conductors 101, 102, 103, and 104 and their proper spacing is essential to produce an asymmetrical strength magnetic field. Thus, the spacing and current requirements can be adjusted based on the desired implementation and/or result.

Figure 2:
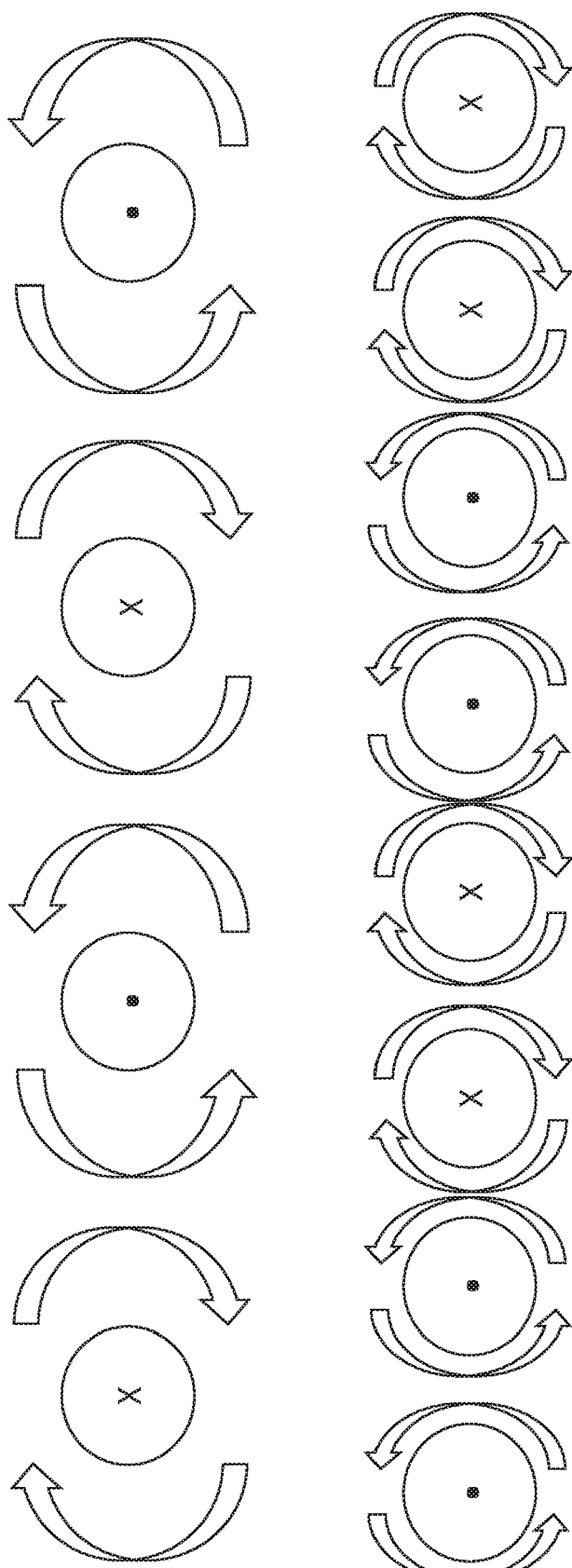
FIG. 2 shows an example implementation of the array of FIG. 1, in accordance with aspects of this disclosure.
Figure 3:
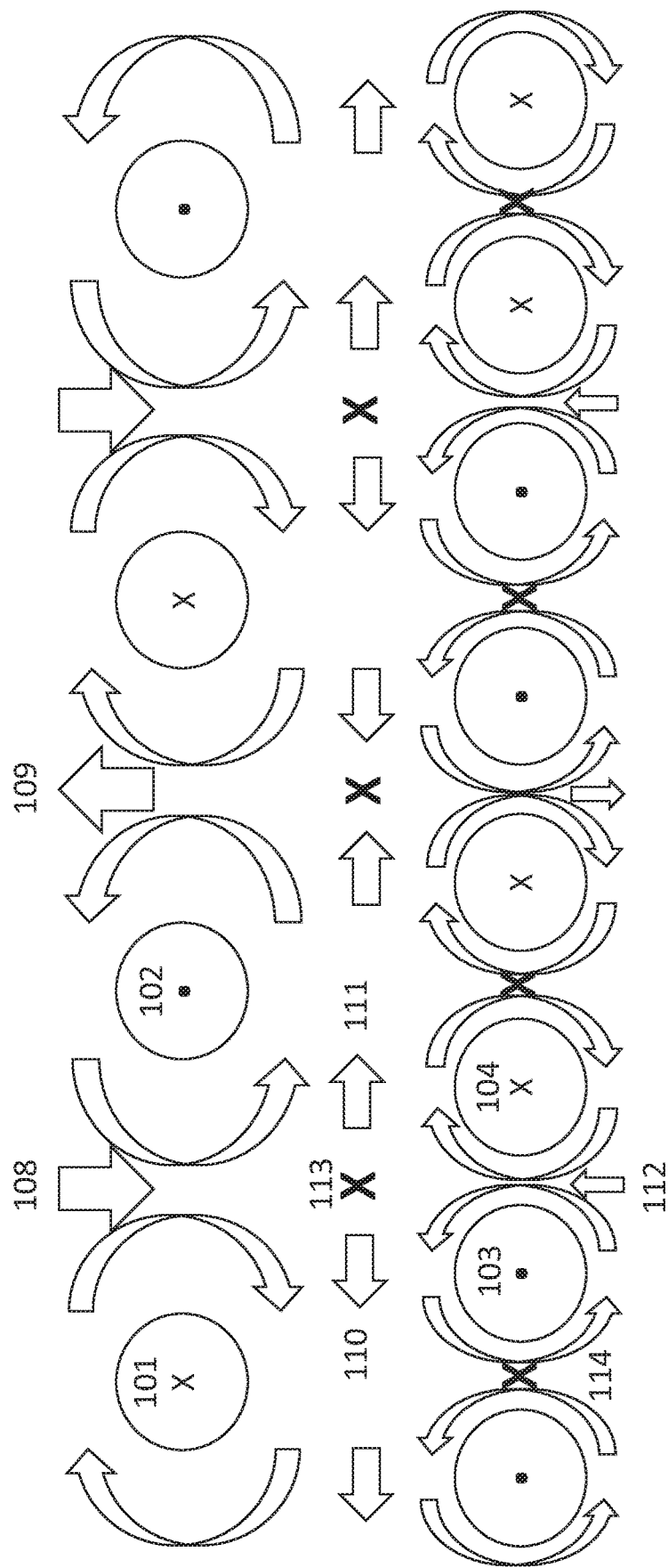
FIG. 3 shows another example implementation of the array of FIG. 1, in accordance with aspects of this disclosure.

FIG. 2 illustrates example magnetic field 107 around the individual conductors. For example, the magnetic field direction, 107, can be found using the right-hand-rule. Current flowing into the plane of the page forms a clockwise magnetic field and current flowing out of the plane of the page forms a counter clockwise magnetic field. The strength of the magnetic field around a conductor can be found by Ampere's Law $$B=(u_0*I)/(2*pi*r)$$

Where B in the magnetic field strength, $u_0$ is the permeability of free space I is the current, and r is the radial distance from the conductor Thus, as shown in FIG. 3, the sum of the individual conductors magnetic fields can either work together to enhance the field strength or work against each other to cancel out the fields. For instance, the arrows are the sum of the fields, with the size of the arrow denoting its relative strength. An "X" between conductors represents the cancellation of the magnetic fields where the magnetic fields are pointing at or away from each other.

Thus, as shown, arrow 108 represents the sum of the magnetic fields produced by conductors 101 and 102 in the top plane 105. Arrow 109 represents the sum of the magnetic fields produced by conductor 102 and the adjacent conductor in the top plane 105. Arrow 110 represents the sum of the magnetic fields produced by conductor 101 in the top plane and conductor 103 in the bottom plane 106.

Arrow 111 represents the sum of the magnetic fields produced by conductor 102 in the top plane and 104 in the bottom plane. Arrow 112 represents the sum of the magnetic fields produced by conductors 103 and 104 in the bottom plane. Further, arrow 113 represents the cancellation of magnetic fields 110 and 111 and magnetic fields 108 and 112, whereas arrow 114 represents the cancellation of magnetic fields produced by 103 and the adjacent conductor in the bottom plane. Note that the conductors 101, 102 in the top plane 105 and the conductors 103, 104 the bottom plane 106 work together to enhance the magnetic field strength in this direction.

Figure 4:
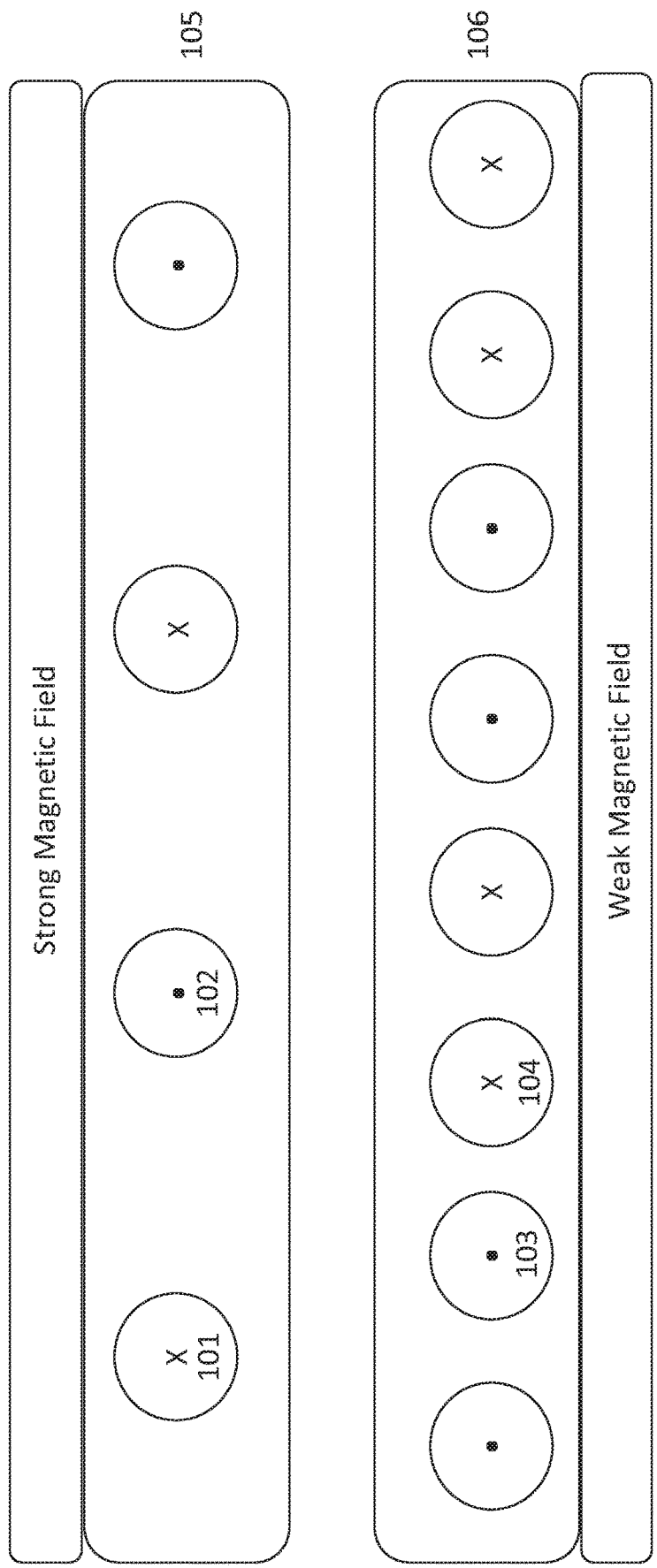
FIGS. 4-6 show additional example implementations of the array of FIG. 1, in accordance with aspects of this disclosure.
Figure 5:
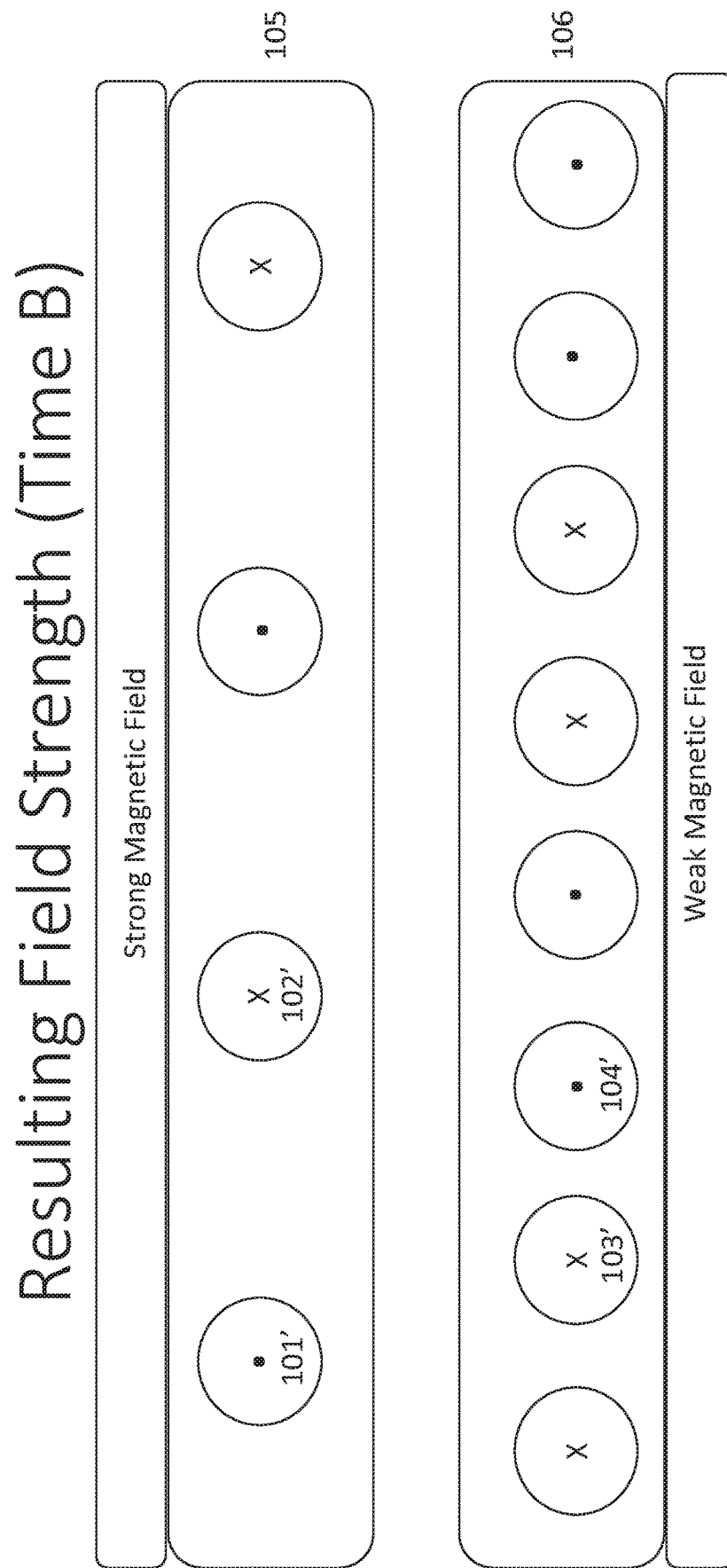

FIG. 4 illustrates the resulting field strength at a time "A". The amperage and the particular spacing of the conductors generates a strong magnetic field on one side and a weak magnetic field on the opposite side. As shown in FIG. 5, the current direction alternates at time "B" for all conductors, yet the strong magnetic field is always on the same side and the weak is always opposite of that side. For example, alternating current is used for induction heating and inductive wireless power transmission. From time "A" to time "B", the flow of current reverses from 101, 102, 103, and 104 to 101', 102', 103', and 104'. The magnetic field produced has the same magnitude with opposite polarity.

Figure 6:
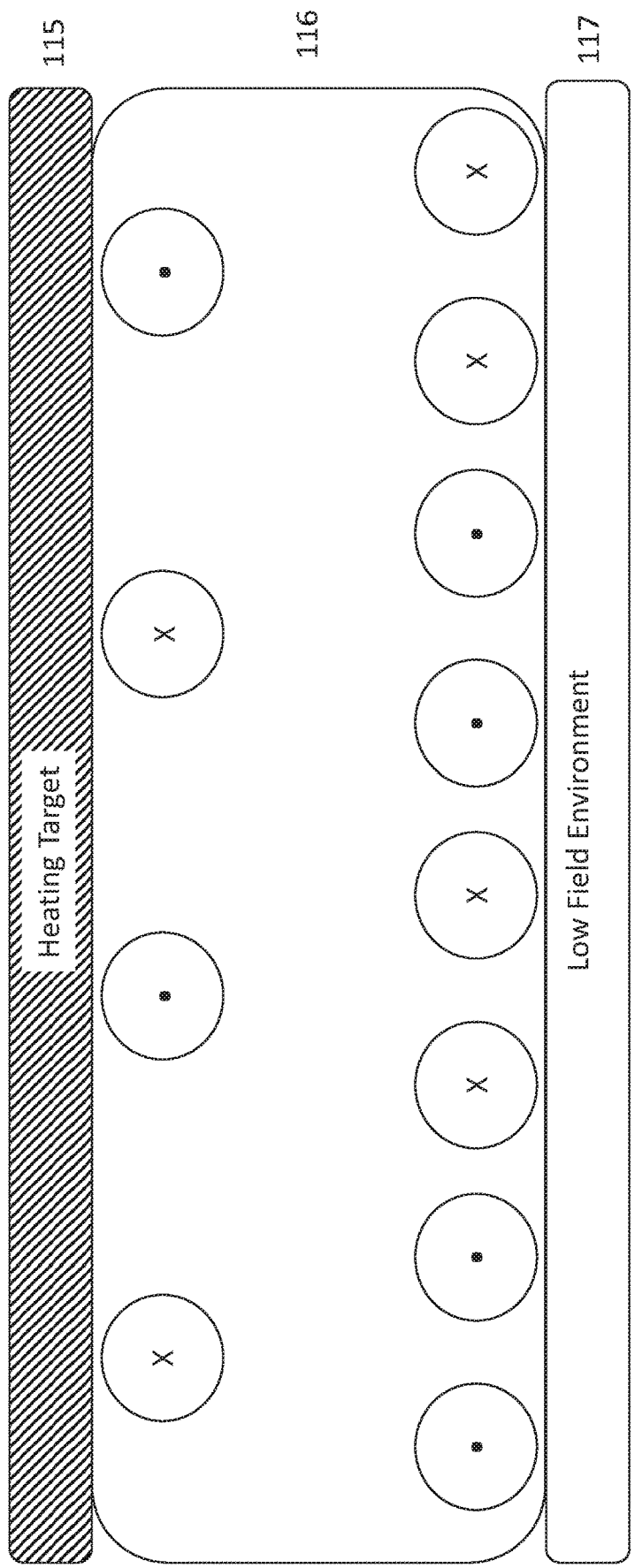

FIG. 6 illustrates an array and a heating target to induce induction heating from the generated magnetic field. For example, when a metallic object (e.g., the heating target) is placed within the heating target region, 115, according to Lenz's Law, an opposing eddy current will be induced in the metallic object to produce a magnetic field opposing that created by a device 116 (e.g., including top and bottom planes 105, 106). The heating effect produced by the eddy currents can be significant. Conversely, placing a metallic object within the low field environment, 117, the object will not heat significantly as the field strength is not strong enough to induce meaningful eddy currents. In some examples, the metallic object (e.g., a ferromagnetic material) can show effects consistent with hysteresis when, for instance, magnetic induction lags behind the magnetizing force from the induced magnetic field.

Figure 7:
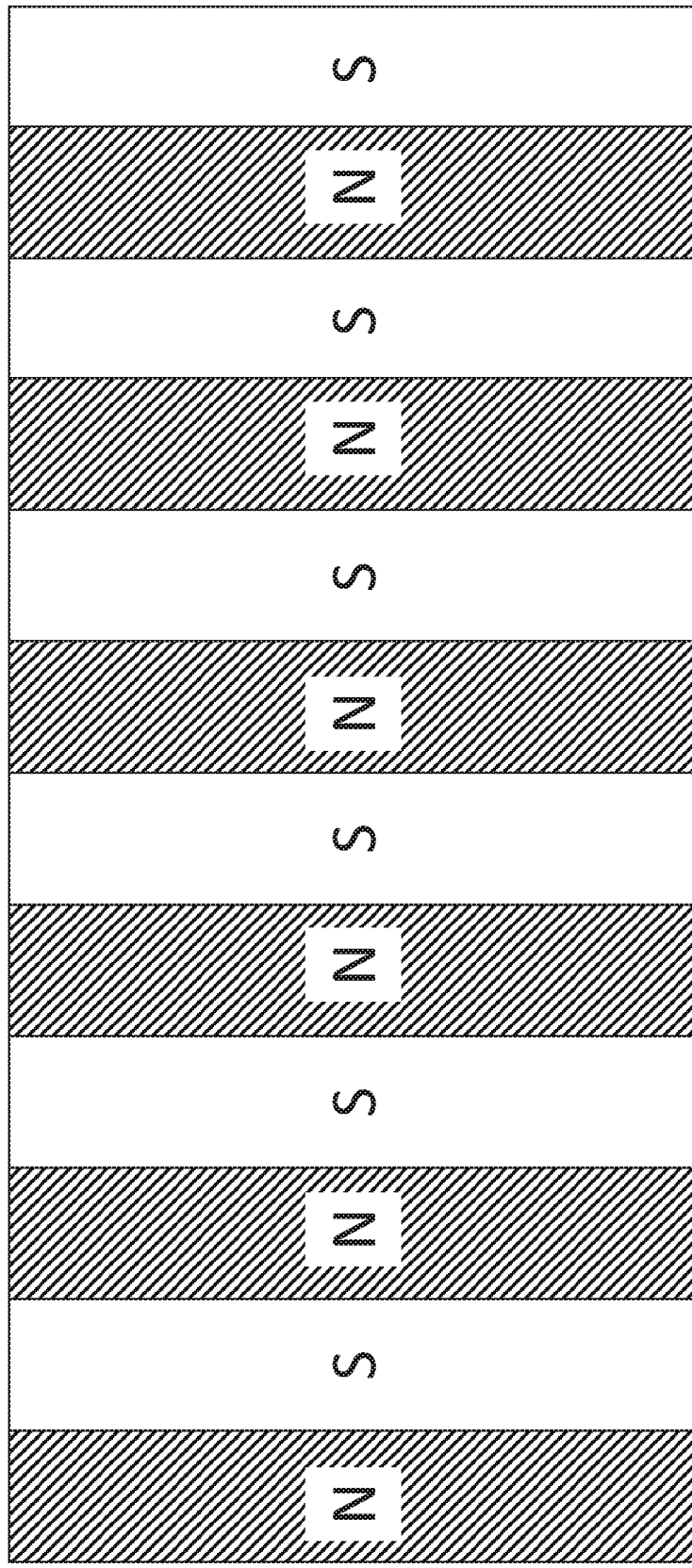
FIGS. 7 and 8 show example field strengths of the array of FIG. 1, in accordance with aspects of this disclosure.
Figure 8:
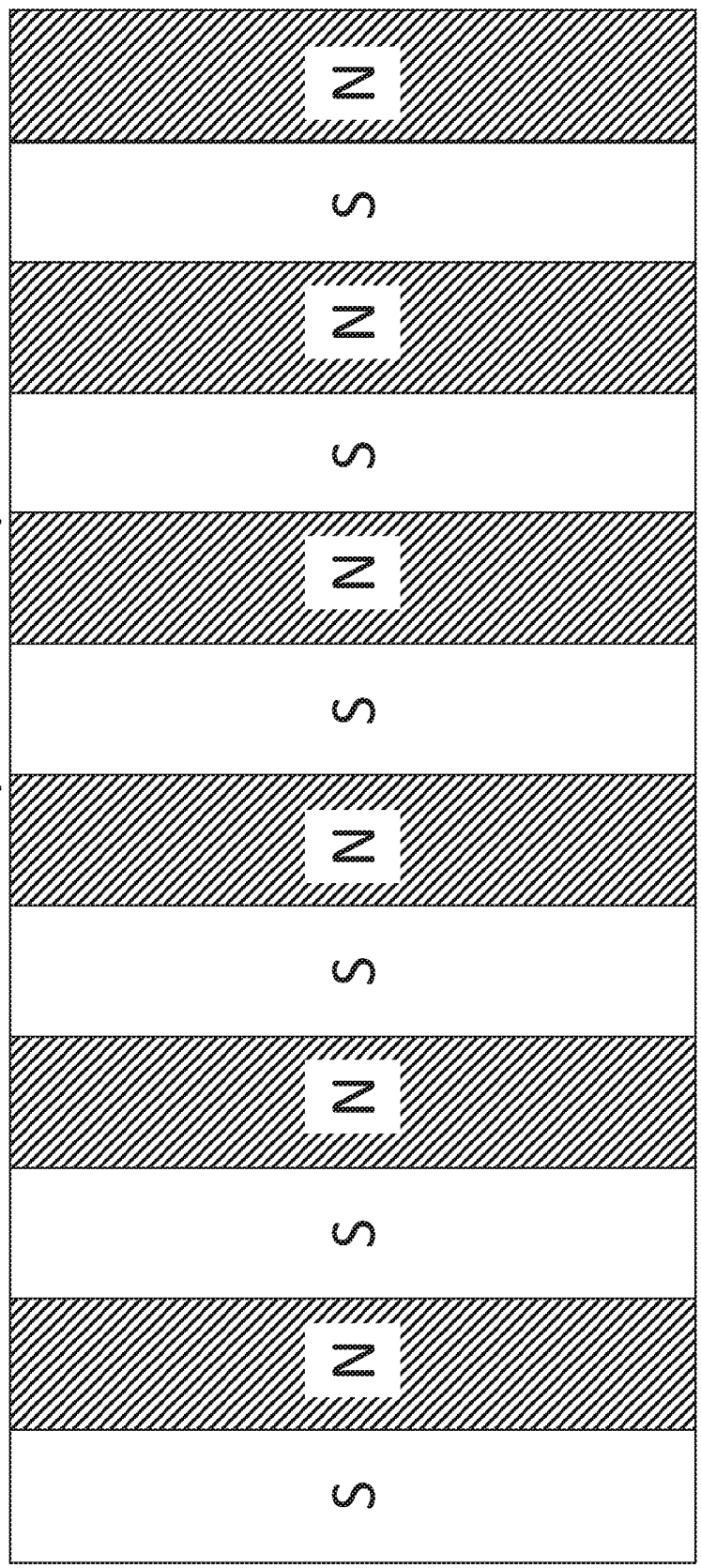

FIGS. 7 and 8 illustrate a top view of the device 116, representing the magnetic polarity as experienced by the region 115. FIG. 7 represents the magnetic field arrangement at time "A" induced by the application of current in the conductors 101, 102, 103, and 104, corresponding to FIG. 4, whereas FIG. 8 represents the magnetic field arrangement at time "B" induced by the application of current in the conductors 101', 102', 103', and 104', corresponding to FIG. 5.

Figure 9:
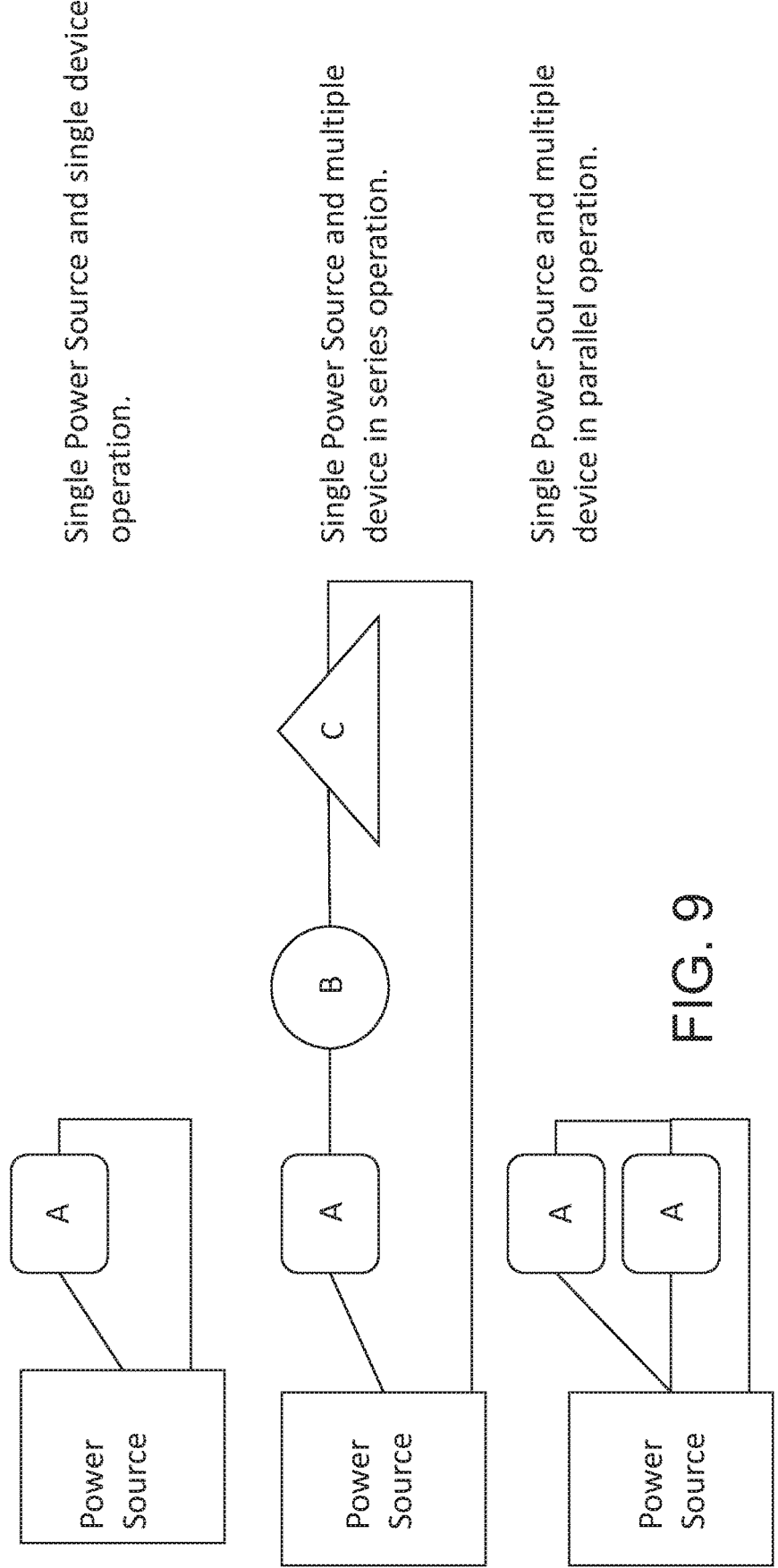
FIGS. 9-11 show example implementations of multiple arrays, in accordance with aspects of this disclosure.

FIG. 9 illustrates an application of several devices (e.g., similar to device 116) to generate asymmetric magnetic fields. In the first example, a power source is connected to a single device A. In a second example, a single power source connects multiple devices A, B and C in series. Note that each of the devices A, B and C have a unique geometry and can thus conform to a variety of applications. In a third example, two device A are connected in parallel. It is noted that devices having similar characteristics (e.g., geometry, configuration, size, power rating, etc.) as well as devices of dissimilar characteristics can be connected in either series or parallel.

Figure 10:
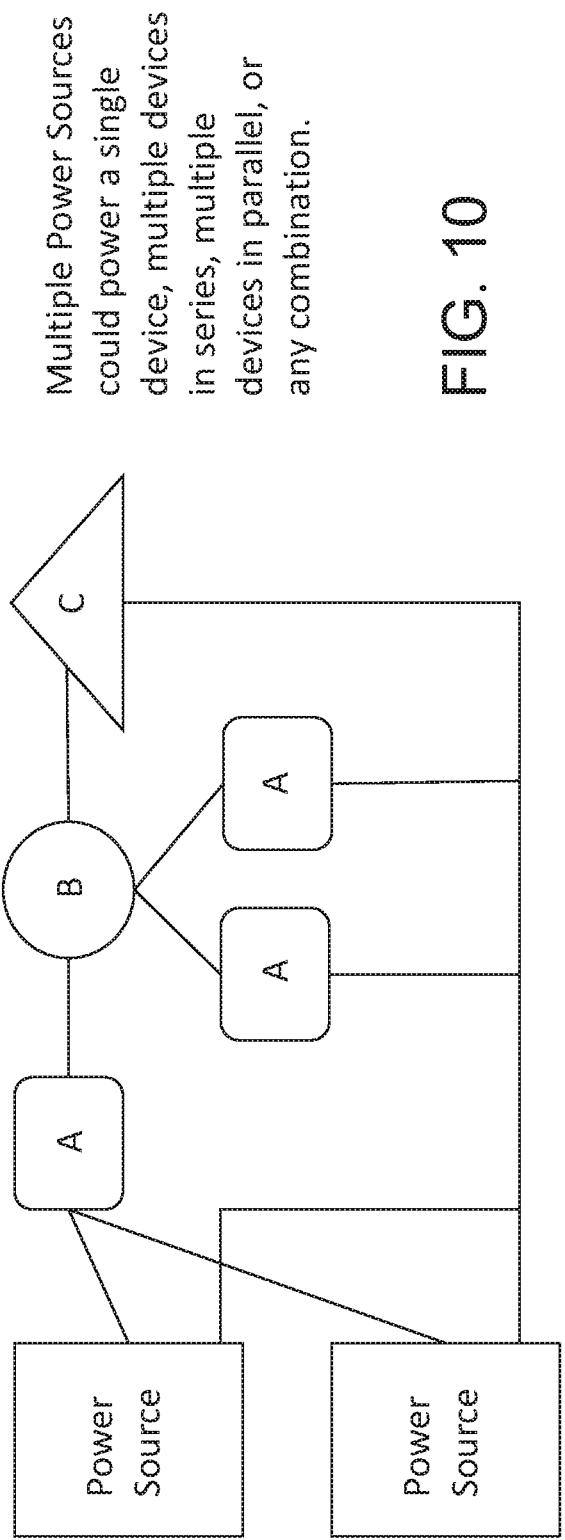

FIG. 10 illustrates an example with two power sources connected to various devices. As shown, the power sources can be connected in a variety of ways, including parallel, series, and a combination of the two. The power sources can be used to activate a subset of devices, or enhance the power supplied to one or more device, or one or more subsets of devices.

Figure 11:
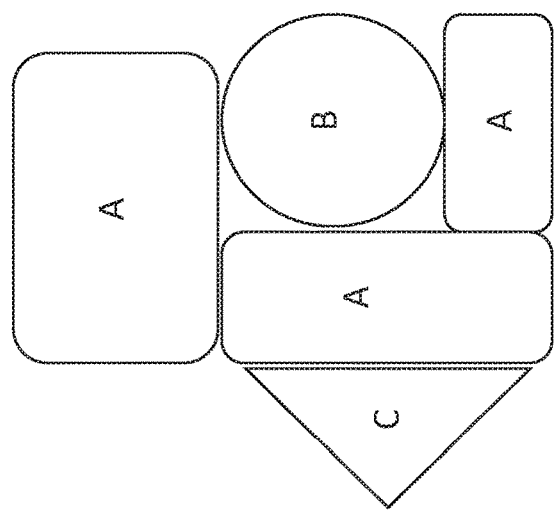

As provided in FIG. 11, devices of various shapes can be combined to define an irregular shape. In this manner, the shape of the combined device can be customized for a particular application, such as heating a workpiece with an irregular shape, bends, or multiple components (e.g., a junction of two pipes to be welded). In some examples, each device is defined by multiple regions. For instance, each region is associated with a magnetic field oriented with a polarity other than a polarity of the magnetic field of each adjacent region. Each device can thus be separated into distinct areas, which include one or more regions for selective application of an electric current. In this arrangement, each region and/or area can be energized to generate a magnetic field in a proper subset of the regions of the device. Any one or more regions can be selectively energized, regardless of orientation of the magnetic field in that region and whether an adjacent region is similarly energized.

Additionally, the combined device may be energized as a complete unit, each of the multiple devices can be energized separately, and/or each region of the multiple devices may be energized selectively. In an example, non-contiguous of one or more devices are energized, whereas other regions are not. In another example, only a portion of a selected region is energized.

Figure 12:
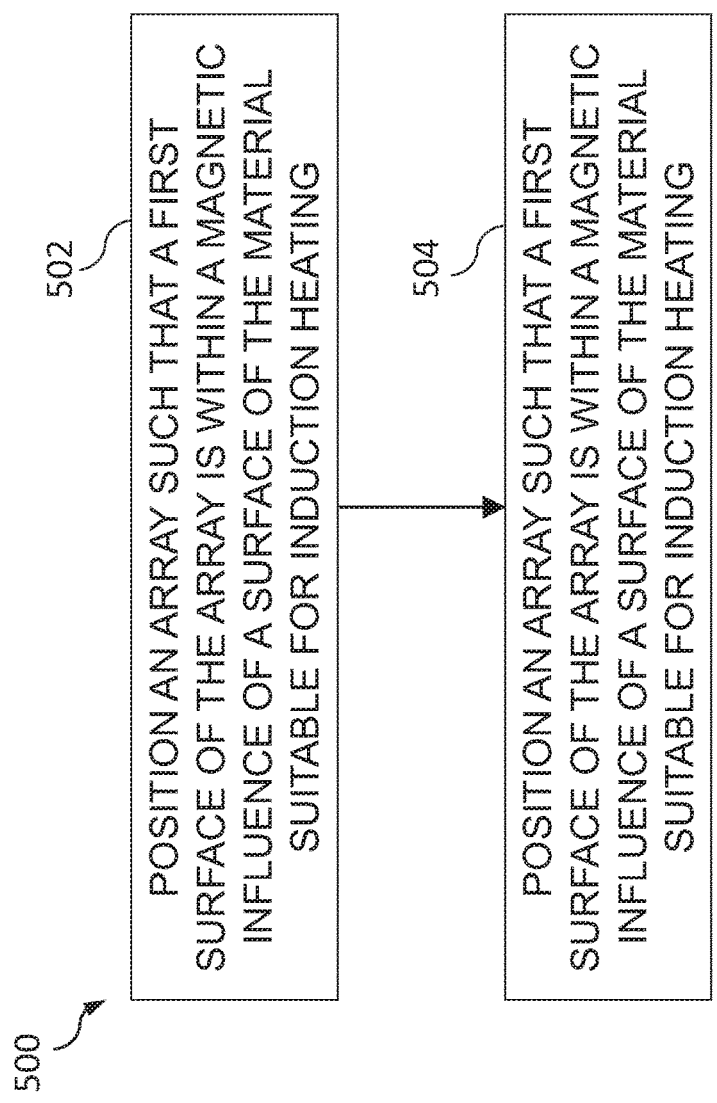
FIG. 12 is a flowchart illustrating an example method of inducing heating in a material suitable for induction heating using an array, in accordance with aspects of this disclosure.

FIG. 12 provides a flowchart describing a method 500 of inducing heating in a material. At block 502, an array is positioned such that a first surface of the array is within a magnetic influence of a surface of the material suitable for induction heating. At block 504, electric current is selectively applied to a first region and another region of the array to generate a magnetic field at one of the first region and the other region sufficient to induce heating in the material.

Figure 13:
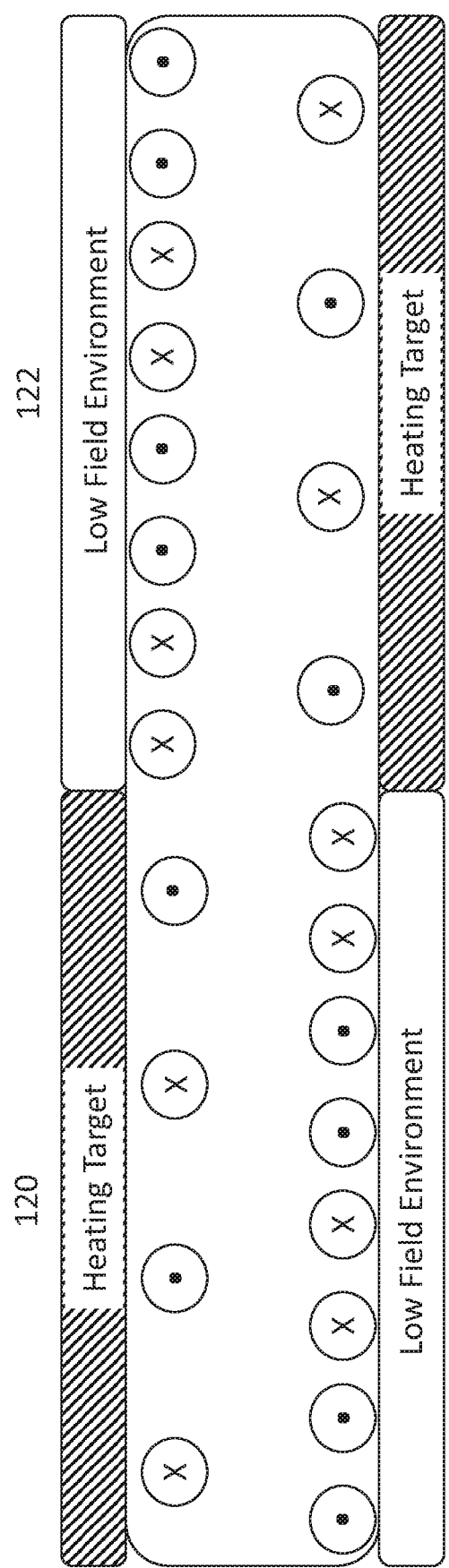
FIG. 13 shows another example array and two heating targets to induce induction heating from the generated magnetic field, in accordance with aspects of this disclosure.

FIG. 13 illustrates another example array and two heating targets to induce induction heating from the generated magnetic field. With reference to FIG. 6, the region 120 of the array is configured to heat an object on a first surface of the ray, as described herein. A second region 122 of the array is configured to heat an object at a second surface. In some examples, multiple regions can be positioned adjacent one another, such that each adjacent magnetic field has an opposite polarity. In the example of FIG. 13, the conductors of a flexible array are arranged such that the magnetic fields generated on a surface of a flexible array may be capable of self-attraction (e.g., one portion of the flexible array being electrically and/or magnetically attracted to another portion of the flexible array) which may result in a curling of the array when energized, becoming a type of electronic "muscle" or actuator. In this manner, the substrate can curl or wrinkle, depending on how the array is selectively energized, the current applied, type of conductor used, and how the conductors are arranged within the substrate. In this example, attractive forces at each surface that experiences a strong magnetic field may cause the region to curl or bend onto itself in response to an electric current. Thus, the device or a particular region thereof may curl around a neutral or central axis onto itself. In a device that includes many combined arrays (see, e.g., FIG. 11), the net effect may be the whole of the array experiencing a two-dimensional compression or "shrinking" (e.g., in the X-Y plane), although bending may cause displacement in the third-dimension aligned with the magnetic fields (e.g., along the Z-axis).

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or." As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y and z." As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A system to provide induction heating comprising:
   a welding-type power supply to apply an electric current;
   a first electromagnetic array formed on a first substrate; and
   a second electromagnetic array formed on a second substrate, each array comprising:
      a plurality of conductors arranged in a varying configuration such that, upon application of the electric current, each conductor of the plurality of conductors generates a magnetic field in a polarity that is other than a polarity of a corresponding magnetic field of at least one adjacent conductor; and
      a first surface and a second surface opposite the first surface, the first surface having a strong magnetic field relative to a weak magnetic field associated with the second surface in response to the electric current.

2. The system as defined in claim 1, wherein the first electromagnetic array and the second electromagnetic array are connected to form one or more of a regular shape or an irregular shape.

3. The system as defined in claim 2, wherein the regular shape comprises at least one of a triangular shape, a rectangular shape, a circular shape, and an annulus.

4. The system as defined in claim 2, wherein the irregular shape comprises a curved shape, an L-shaped shape, a U-shaped shape, and an M-shaped shape.

5. The system as defined in claim 1, wherein the first electromagnetic array and the second electromagnetic array are electrically connected in parallel.

6. The system as defined in claim 1, wherein the first electromagnetic array and the second electromagnetic array are electrically connected in series.

7. The system as defined in claim 1, wherein each array is overmolded with a substance comprising one or more of silicone, polymers, or rubber.

8. The system as defined in claim 7, wherein the substance is doped with a material selected to increase magnetic permeability of each array.

9. The system as defined in claim 1, comprising a layer of resistive heating elements overlying each substrate.

10. The system as defined in claim 1, wherein each substrate comprises a flexible material.

11. The system as defined in claim 1, wherein the flexible material is a flexible printed circuit board.

12. The system as defined in claim 11, wherein the flexible material comprises one or more of a polyimide film, polyamide film, or a polyester resin.

13. A system to provide induction heating comprising:
   a first electromagnetic array formed on a first substrate electrically connected to a first welding-type power supply to apply a first electric current; and
   a second electromagnetic array formed on a second substrate electrically connected to a second welding-type power supply to apply a second electric current, each array comprising:
      a plurality of conductors arranged in a varying configuration such that, upon application of the first or second electric current, each conductor of the plurality of conductors generates a magnetic field in a polarity that is other than a polarity of a corresponding magnetic field of at least one adjacent conductor; and
      a first surface and a second surface opposite the first surface, the first surface having a strong magnetic field relative to a weak magnetic field associated with the second surface in response to the electric current.

14. The system as defined in claim 13, further comprising a controller to control the first and second power supplies to apply the first and second electric currents to the first and second electromagnetic arrays, respectively.

15. The system as defined in claim 14, wherein application of the first and second electric currents generate magnetic fields to attract a material suitable for induction heating to the first and second electromagnetic arrays.

16. The system as defined in claim 13, further comprising a controller to control the first power supply to selectively apply the first electric current to the first electromagnetic array independently of the second power supply and the second electromagnetic array.

17. The system as defined in claim 13, wherein the first electromagnetic array, the second electromagnetic array, the first power supply and the power supply are electrically connected in one of parallel or series.

18. The system as defined in claim 13, further comprising a frame configured to modify an area of one of the first electromagnetic array or the second electromagnetic array.

19. The system as defined in claim 18, wherein the frame comprises a variable length and/or shape, the frame configured to modify the area of the system to one or more desired shapes.

20. The system as defined in claim 18, wherein the frame comprises another electromagnet to cause an attractive force to compress the footprint of the array when activated.

* * * * *